United States Patent
Lu (10) Patent No.: US 9,553,537 B1
(45) Date of Patent: Jan. 24, 2017

(54) DE-GLITCH CIRCUIT AND DE-GLITCH METHOD AND SHORT CIRCUIT PROTECTION DEVICE

(71) Applicant: ACTRON TECHNOLOGY CORPORATION, Taoyuan (TW)

(72) Inventor: Chih-Chun Lu, Taoyuan (TW)

(73) Assignee: ACTRON TECHNOLOGY CORPORATION, Taoyuan (TW)

( * ) Notice: Subject to any disclaimer, the term of this patent is extended or adjusted under 35 U.S.C. 154(b) by 11 days.

(21) Appl. No.: 14/854,028

(22) Filed: Sep. 14, 2015

(30) Foreign Application Priority Data

Jul. 16, 2015 (TW) .............................. 104123032 A (51) Int. Cl.
H03K 5/19 (2006.01)
H02P 9/10 (2006.01)

(52) U.S. Cl.
CPC ..................... H02P 9/102 (2013.01)

(58) Field of Classification Search
CPC ....................................................... H02P 9/102
USPC ............................................................ 327/20
See application file for complete search history.

(56) References Cited

U.S. PATENT DOCUMENTS

| 5,526,339 | A | * | 6/1996 | Shimada | G11B 7/005 |
| | | | | | 369/116 |
| 5,754,606 | A | * | 5/1998 | Matsuyama | H03L 7/081 |
| | | | | | 375/373 |
| 7,129,763 | B1 | * | 10/2006 | Bennett | G06F 1/3203 |
| | | | | | 327/262 |
| 2004/0183709 | A1 | * | 9/2004 | Kobayashi | H03M 1/18 |
| | | | | | 341/164 |
| 2009/0135302 | A1 | * | 5/2009 | Miyashita | H04N 9/70 |
| | | | | | 348/638 |
| 2010/0259330 | A1 | * | 10/2010 | Nakai | H03G 3/3026 |
| | | | | | 330/279 |
| 2013/0229214 | A1 | * | 9/2013 | Ichida | H03L 7/081 |
| | | | | | 327/158 |
| 2014/0167813 | A1 | * | 6/2014 | Raychowdhury | H03K 19/0008 |
| | | | | | 326/33 |
| 2016/0135264 | A1 | * | 5/2016 | Vaughan | H05B 33/0845 |
| | | | | | 315/250 |

FOREIGN PATENT DOCUMENTS

TW 200639611 11/2006

OTHER PUBLICATIONS

"Office Action of Taiwan Counterpart Application", issued on Jul. 5, 2016, p. 1-p. 4.

* cited by examiner

*Primary Examiner* — Ryan Jager
(74) *Attorney, Agent, or Firm* — Jianq Chyun IP Office (57) ABSTRACT

A de-glitch circuit, a de-glitch method and a short circuit protection device are provided. In a period during which a first flag signal is in a first logic state, the de-glitch circuit increases a counting result with a rising rate. In a period during which the first flag signal is in a second logic state, the de-glitch circuit decreases the counting result with a falling rate, wherein the rising rate is greater than the falling rate. The de-glitch circuit sets a logic state of a second flag signal according to a relationship between the counting result and a threshold.

20 Claims, 8 Drawing Sheets

DE-GLITCH CIRCUIT AND DE-GLITCH METHOD AND SHORT CIRCUIT PROTECTION DEVICE

CROSS-REFERENCE TO RELATED APPLICATION

This application claims the priority benefit of Taiwan application serial no. 104123032, filed on Jul. 16, 2015. The entirety of the above-mentioned patent application is hereby incorporated by reference herein and made a part of this specification.

BACKGROUND OF THE INVENTION

Field of the Invention

The invention relates to a de-glitch technology, and more particularly, relates to a de-glitch circuit, a de-glitch method and a short circuit protection device.

Description of Related Art

Figure 1:
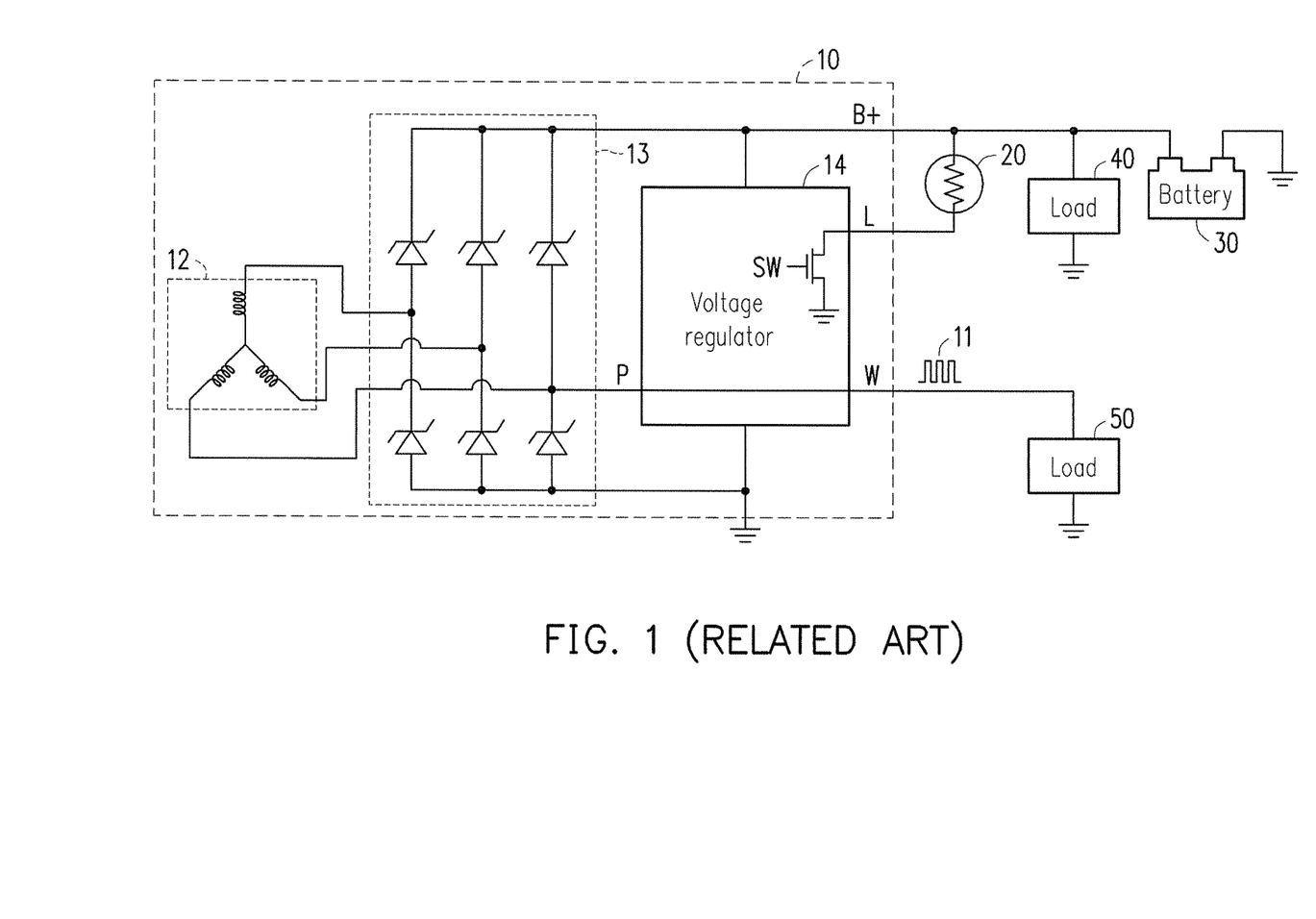
FIG. 1 is a schematic diagram illustrating an alternator of the conventional art.

FIG. 1 is a schematic diagram illustrating an alternator 10 of the conventional art. The alternator 10 can be applied in cars, trains or other devices capable of providing a mechanical energy. The alternator 10 is commonly disposed with a power module 12, a rectification circuit 13 and a voltage regulator 14 inside. The power module 12 inside the alternator 10 can transform the mechanical energy into an Alternating Current (AC) power. The rectification circuit 13 is configured to convert the AC power into a Direct Current (DC) power, and the DC power can be provided to a load circuit (e.g., an indicator 20, a battery 30 and/or a load 40 as depicted in FIG. 1). The voltage regulator 14 is configured to regulate a voltage level of the DC power outputted by the rectification circuit 13. In general, alternator 10 adopts a three-phase or six-phase full wave rectification, wherein one phase AC power (also known as a phase signal) in a multi-phase AC power outputted by the power module 12 is connected to a P terminal of the voltage regulator 14. In some specific applications such as a diesel vehicle or a large-sized vehicle, the phase signal connected to the P terminal of the voltage regulator 14 is outputted to the load circuit (e.g., a load 50 depicted in FIG. 1) through a W terminal of the voltage regulator 14.

Generally, the voltage regulator 14 is also disposed with an indicator switch SW. The indicator switch SW has one terminal connected to a ground voltage and another terminal connected to one terminal of the indicator 20 through an indicator pin L of the voltage regulator 14. Another terminal of the indicator 20 can be connected to a system voltage B+. Generally, the system voltage B+ is a DC voltage. The voltage regulator 14 can control the indicator switch SW to thereby control an on/off state of indicator 20. Accordingly, the indicator 20 can present state information of the alternator 10.

In some unexpected scenarios, the indicator pin L may be short-circuited to an unexpected voltage source. When a short circuit event occurs on the indicator pin L (e.g., the indicator pin L is accidentally in direction connection with the system voltage B+) and sustains for over a confirmation time, the voltage regulator 14 of the alternator 10 can activate a protection mechanism to turn off the indicator switch SW, so as to prevent the indicator switch SW from burn-out. If the short circuit event does not sustain for the confirmation time, the voltage regulator 14 of the alternator 10 will not activate the protection mechanism. The confirmation time can prevent the protection mechanism from being mistakenly triggered by noise signals.

In an initializing period of the indicator 20 (approximately 20 milliseconds or longer), an initial resistance of the indicator 20 is very small due to low temperature. Only after the initializing period is ended, the resistance of the indicator 20 begins to rise from the initial resistance to a normal resistance due to increasing temperature. In the initializing period when the indicator 20 is activated, the protection mechanism of the indicator switch SW may be mistakenly triggered because the initial resistance of the indicator 20 is very small. Considering such characteristic of the indicator 20, the confirmation time must be greater than the initializing period during which the indicator 20 is activated, so as to prevent the protection mechanism of the indicator switch SW from being mistakenly triggered because of the small initial resistance of indicator 20. In general, the confirmation time can be set to 30 milliseconds or even longer.

Moreover, it is also possible that the indicator pin L may be unexpectedly short-circuited to an AC voltage source. For instance, the indicator pin L of the alternator 10 may be short-circuited to the W terminal. A voltage outputted by the W terminal is an AC voltage 11, and a pulse width of the AC voltage 11 may be less than the confirmation time (30 milliseconds) of the protection mechanism of the indicator switch SW. When the pulse width of the AC voltage 11 outputted by the W terminal is less than the confirmation time, the protection mechanism of the indicator switch SW will not be triggered/activated.

Figure 2:
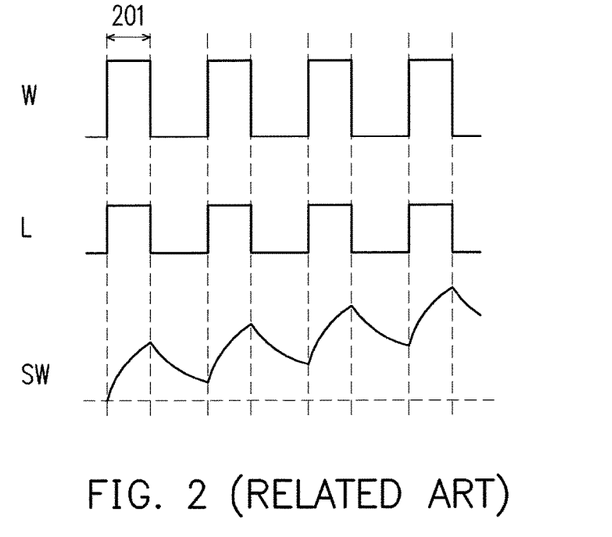
FIG. 2 is a schematic diagram illustrating a temperature variation of the indicator switch SW when the indicator pin L is short-circuited to the W terminal in FIG. 1.

FIG. 2 is a schematic diagram illustrating a temperature variation of the indicator switch SW when the indicator pin L is short-circuited to the W terminal in FIG. 1. A horizontal axis depicted in FIG. 2 represents time. A vertical axis of an upper-portion curve of FIG. 2 represents a voltage of the W terminal of the alternator 10. A vertical axis of a middle-portion curve of FIG. 2 represents a voltage of the indicator pin L of the alternator 10. A vertical axis of lower-portion curve of FIG. 2 represents a temperature of the indicator switch SW of the alternator 10. As described above, the confirmation time of the protection mechanism of the indicator switch SW must be greater than the initializing period of the indicator 20, so as to prevent the protection mechanism of the indicator switch SW from being mistakenly triggered because of the small initial resistance of indicator 20. However, when the short circuit event occurs (when the indicator pin L is short-circuited to the W terminal), because a pulse width 201 of the AC voltage 11 outputted by the W terminal is less than the confirmation time of the protection mechanism of the indicator switch SW, the protection mechanism of the indicator switch SW will not be triggered/activated. In the situation where the protection mechanism of the indicator switch SW is not triggered/activated, the short circuit event can cause a large amount of current to intermittently (periodically) flow through the indicator switch SW, resulting in a continuous rising of temperature at the indicator switch SW. Eventually, the indicator switch SW may be burn-out due to overly-high temperature.

SUMMARY OF THE INVENTION

The invention is directed to a de-glitch circuit, a de-glitch method and a short circuit protection device using the de-glitch circuit. In the situation where the periodic pulse width of the short circuit current of the indicator switch is less than the confirmation time, the periodic pulse of the short circuit current can still trigger the short circuit protection device to ignore the indicator command and turn off the indicator switch.

A de-glitch circuit of the invention is configured to receive a first flag signal and perform a de-glitch operation on the first flag signal in order to output a second flag signal. The de-glitch circuit includes a counting circuit. The counting circuit increases a counting result with a rising rate in a period during which the first flag signal is in a first logic state. The counting circuit decreases the counting result with a falling rate in a period during which the first flag signal is in a second logic state, wherein the rising rate is greater than the falling rate. The counting circuit sets a logic state of the second flag signal according to a relationship between the counting result and a threshold.

A de-glitch method of the invention is used to perform a de-glitch operation on a first flag signal in order to obtain a second flag signal. The de-glitch method includes: increasing a counting result with a rising rate in a period during which the first flag signal is in a first logic state; decreasing the counting result with a falling rate in a period during which the first flag signal is in a second logic state, wherein the rising rate is greater than the falling rate; and setting a logic state of a second flag signal according to a relationship between the counting result and a threshold.

A short circuit protection device of an indicator switch of an alternator of the invention includes a control circuit, a detection circuit and a de-glitch circuit. The detection circuit is coupled to the indicator switch. The detection circuit can detect a current flowing through the indicator switch and set a logic state of a first flag signal according to the current. An input terminal of the de-glitch circuit is coupled to an output terminal of the detection circuit to receive the first flag signal. The de-glitch circuit selects to increase a counting result with a rising rate or decrease the counting result with a falling rate according to the logic state of the first flag signal. Herein, the rising rate is greater than the falling rate. The de-glitch circuit sets a logic state of a second flag signal according to a relationship between the counting result and a threshold. A first input terminal of the control circuit can receive an indicator command. A second input terminal of the control circuit is coupled to an output terminal of the de-glitch circuit to receive the second flag signal. An output terminal of the control circuit is coupled to a control terminal of the indicator switch. The control circuit correspondingly controls the indicator switch according to the logic state of the second flag signal.

Based on the above, the de-glitch circuit and the de-glitch method of the invention are provided. In the situation where a periodic pulse width of the first flag signal is greater than the threshold, the first flag signal can trigger the de-glitch circuit to set the logic state of the second flag signal. In the situation where the periodic pulse width of the first flag signal is less than the confirmation time, the periodic pulse of the first flag signal can still trigger the de-glitch circuit to set the logic state of the second flag signal. In the situation where a non-periodic pulse width of the first flag signal is less than the confirmation time, the non-periodic pulse of the first flag signal will not trigger the de-glitch circuit so that the logic state of the second flag signal can be reset. Accordingly, the de-glitch circuit can be applied in the short circuit protection device. In the situation where the periodic pulse width of the short circuit current of the indicator switch is less than the confirmation time, the periodic pulse of the short circuit current can still trigger the short circuit protection device to ignore the indicator command and turn off the indicator switch.

To make the above features and advantages of the present disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

The term "coupled (or connected)" used in this specification (including claims) may refer to any direct or indirect connection means. For example, "a first device is coupled (connected) to a second device" should be interpreted as "the first device is directly connected to the second device" or "the first device is indirectly connected to the second device through other devices or connection means". Moreover, wherever appropriate in the drawings and embodiments, elements/components/steps with the same reference numerals represent the same or similar parts. Elements/components/steps with the same reference numerals or names in different embodiments may be cross-referenced.

Figure 3:
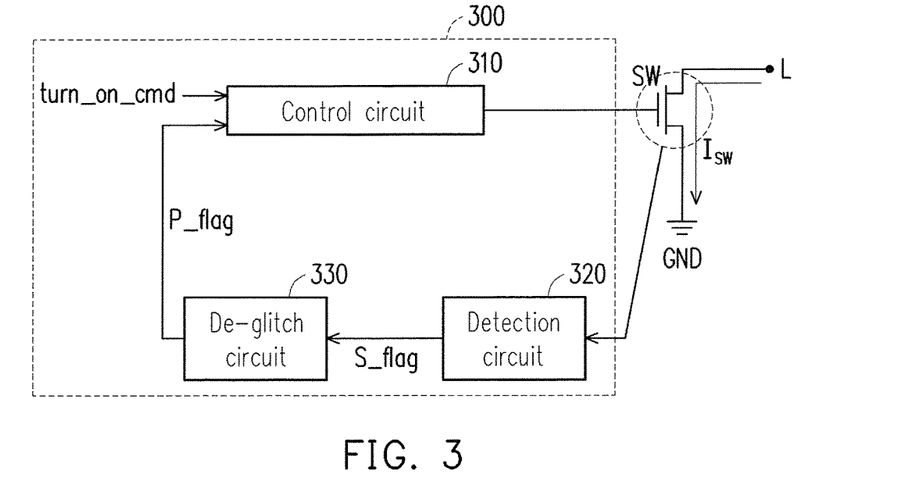
FIG. 3 illustrates a short circuit protection device of the indicator switch SW of the alternator according to an embodiment of the invention.

FIG. 3 illustrates a short circuit protection device 300 of the indicator switch SW of the alternator according to an embodiment of the invention. A first terminal of the indicator switch SW is connected to the indicator pin L of the alternator, and a second terminal of the indicator switch SW is coupled to a ground voltage GND. The indicator switch SW and the indicator pin L depicted in FIG. 3 may refer to related description for FIG. 1, which is not repeated hereinafter. The short circuit protection device 300 depicted in FIG. 3 includes a control circuit 310, a detection circuit 320 and a de-glitch circuit 330.

The detection circuit 320 is coupled to the indicator switch SW. The detection circuit 320 can detect a current Isw flowing through the indicator switch SW and set a logic state of a first flag signal S_flag according to the current Isw. For instance, in a period during which the current Isw is greater than a reference current, the detection circuit 320 can set the logic state of the first flag signal (also known as a short circuit signal) S_flag as a first logic state. Herein, the reference current can be determined according to design requirements. In some embodiments, the first logic state can be an enable state (e.g., logic "1", a high logic electrical potential or other signal states expressing "true"). The reference current may depend on an electric property of the indicator switch SW. In a period during which the current Isw is less than the reference current, the detection circuit 320 can set the logic state of the first flag signal S_flag as a second logic state. In some embodiments, the second logic state can be a disable state (e.g., logic "0", a low logic electrical potential or other signal states expressing "false").

An input terminal of the de-glitch circuit 330 is coupled to an output terminal of the detection circuit 320 to receive the first flag signal S_flag. The de-glitch circuit 330 selects to increase a counting result ACC with a rising rate or decrease the counting result ACC with a falling rate according to the logic state of the first flag signal S_flag. For instance (but not limited thereto), in a period during which the first flag signal S_flag is in the enable state, the de-glitch circuit 330 increases the counting result ACC with the rising rate. In a period during which the first flag signal S_flag is in the disable state, the de-glitch circuit 330 decreases the counting result ACC with the falling rate. Herein, the rising rate is greater than the falling rate. In different exemplary examples, the counting result ACC can be a digital value, a voltage value, a current value or other physical quantities. The de-glitch circuit 330 sets a logic state of a second flag signal (also known as a protection flag signal) P_flag according to a relationship between the counting result ACC and a threshold TH. The threshold TH can be determined according to design requirements.

Figure 4:
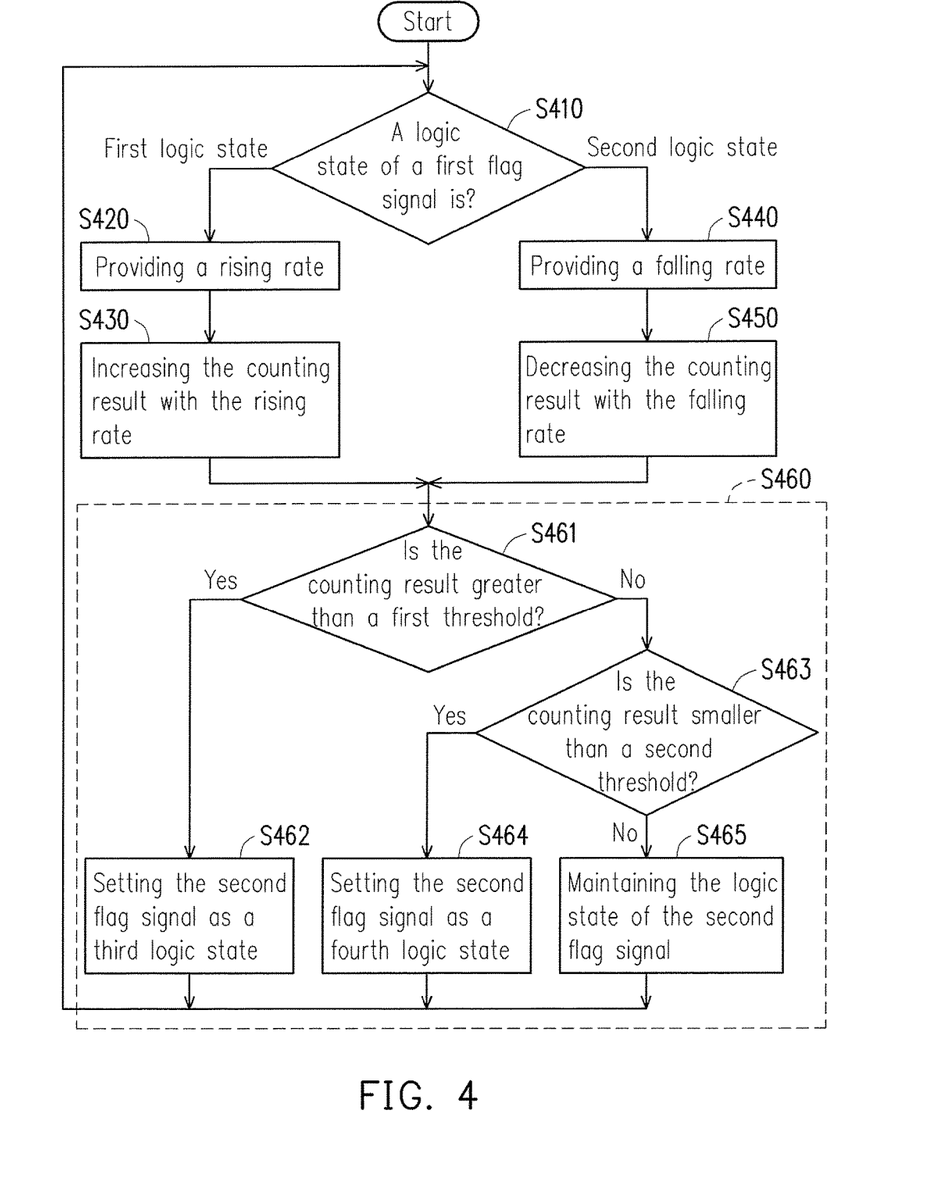
FIG. 4 is a flowchart illustrating a de-glitch method of the de-glitch circuit depicted in FIG. 3 according to an embodiment of the invention.

FIG. 4 is a flowchart illustrating a de-glitch method of the de-glitch circuit 330 depicted in FIG. 3 according to an embodiment of the invention. The de-glitch method can perform a de-glitch operation on the first flag signal S_flag to obtain the second flag signal P_flag. Referring to FIG. 4, the de-glitch circuit 330 determines the logic state of the first flag signal S_flag in step S410. If the first flag signal S_flag is in the first logic state, the de-glitch circuit 330 performs step S420 and step S430. The de-glitch circuit 330 may include a rate circuit and a counting circuit, the rate circuit provides the rising rate to the counting circuit in the period during which the first flag signal S_flag is in the first logic state (step S420), and the counting circuit of the de-glitch circuit 330 increases the counting result ACC with the rising rate provided by the rate circuit (step S430). The rate circuit and the counting circuit will be described in detail later. The rate circuit may refer to a rate circuit 331 depicted in FIG. 7 and FIG. 8 or refer to a rate circuit 334 depicted in FIG. 9. The counting circuit may refer to a counting circuit 332 depicted in FIG. 7, or refer to a counting circuit 333 depicted in FIG. 8, or refer to a counting circuit 335 depicted in FIG. 9.

If the first flag signal S_flag is in the second logic state, the de-glitch circuit 330 performs step S440 and step S450. The rate circuit of the de-glitch circuit 330 provides the falling rate to the counting circuit of the de-glitch circuit 330 in the period during which the first flag signal S_flag is in the second logic state (step S440), and the counting circuit of the de-glitch circuit 330 decreases the counting result ACC with the falling rate provided by the rate circuit (step S450).

After step S430 or step S450 is completed, the de-glitch circuit 330 continues to perform step S460. In step S460, the counting circuit of the de-glitch circuit 330 can set the logic state of the second flag signal P_flag according to the relationship between the counting result ACC and the threshold TH. For instance (but not limited thereto), the step S460 depicted in FIG. 4 includes sub steps S461 to S465, and the threshold TH includes a first threshold TH1 and a second threshold TH2. After step S430 or step S450 is completed, the de-glitch circuit 330 continues to perform step S461. The counting circuit of the de-glitch circuit 330 can compare the counting result ACC with the first threshold TH1 (step S461). When determining that the counting result ACC is greater than or equal to the first threshold TH1 in step S461, the counting circuit of the de-glitch circuit 330 sets the logic state of the second flag signal P_flag as a third logic state (step S462). In some embodiments, the third logic state can be the enable state (e.g., logic "1", a high logic electrical potential or other signal states expressing "true").

When determining that the counting result ACC is less than the first threshold TH1 in step S461, the counting circuit of the de-glitch circuit 330 continues to perform step S463. In step S463, the counting circuit of the de-glitch circuit 330 can compare the counting result ACC with the second threshold TH2. When determining that the counting result ACC is less than or equal to the second threshold TH2 (the second threshold TH2 is less than the first threshold TH1) in step S463, the counting circuit of the de-glitch circuit 330 sets the logic state of the second flag signal P_flag as a fourth logic state (step S464). In some embodiments, the fourth logic state can be the disable state (e.g., logic "0", a low logic electrical potential or other signal states expressing "false"). When determining that the counting result ACC is greater than the second threshold TH2 in step S463, the counting circuit of the de-glitch circuit 330 maintains the logic state of the second flag signal P_flag (step S465).

Referring to FIG. 3, a first input terminal of the control circuit 310 can receive an indicator command turn_on_cmd from a previous-state circuit (not illustrated). A second input terminal of the control circuit 310 is coupled to an output terminal of the de-glitch circuit 330 to receive the second flag signal P_flag. An output terminal of the control circuit 330 is coupled to a control terminal of the indicator switch SW. The control circuit 310 correspondingly controls the indicator switch SW according to the logic state of the second flag signal P_flag. For instance (but not limited thereto), the control circuit 310 can correspondingly control the indicator switch SW according to the indicator command turn_on_cmd in a period during which the second flag signal P_flag is in the disable state. The control circuit 310 can ignore the indicator command turn_on_cmd and control the indicator switch SW to be turned off in a period during which the second flag signal P_flag is in the enable state. Accordingly, when the short circuit event occurs on the indicator switch SW, the control circuit 310 can instantly turn off the indicator switch SW, so as to prevent the indicator switch SW from burn-out.

Figure 5:
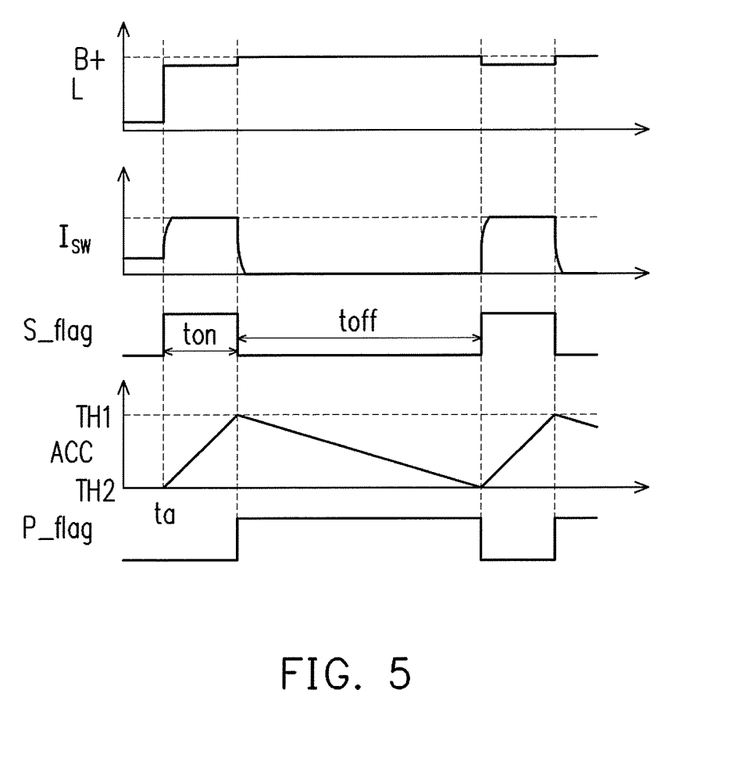
FIG. 5 is a waveform diagram of the counting result ACC and other signals of the de-glitch circuit in the situation where the short circuit event occurs on the indicator pin L (e.g., when the indicator pin L is directly connected to the system voltage B+).

FIG. 5 is a waveform diagram of the counting result ACC and other signals of the de-glitch circuit 330 in the situation where the short circuit event occurs on the indicator pin L (e.g., when the indicator pin L is directly connected to the system voltage B+). Referring to FIG. 3 and FIG. 5, it is assumed that, at a time point ta, the indicator pin L is short-circuited to the system voltage B+. Generally, the system voltage B+ is the DC voltage. When the indicator pin L is short-circuited to the system voltage B+, the current Isw flowing through the indicator switch SW will exceed the reference current, such that the detection circuit 320 is triggered to set the logic state of the first flag signal S_flag as the enable state. In the period during which the first flag signal S_flag is in the enable state, the de-glitch circuit 330 increases the counting result ACC with the rising rate until the counting result ACC reaches the first threshold TH1. The rising rate of the counting result ACC can determine a time required for the counting result ACC to reach the first threshold TH1 (i.e., a confirmation time ton depicted in FIG. 5). The confirmation time ton can be determined based on design requirements. For instance (but not limited thereto), in the application scenario where the short circuit protection device 300 depicted in FIG. 3 is applied in the alternator 10 depicted in FIG. 1, the confirmation time ton can be greater than the initializing period when the indicator 20 depicted in FIG. 1 is activated. For example, the confirmation time ton can be set to 30 milliseconds or even longer. As another example, the confirmation time ton can depend on a maximum power amount endurable by the indicator switch SW. The confirmation time ton can prevent the protection mechanism of the indicator switch SW from being mistakenly triggered by noise signals.

When the de-glitch circuit 330 determines that the counting result ACC is greater than or equal to the first threshold TH1, the de-glitch circuit 330 sets the logic state of the second flag signal P_flag as the enable state. The control circuit 310 can ignore the indicator command turn_on_cmd and control the indicator switch SW to be turned off in the period during which the second flag signal P_flag is in the enable state. In a period during which the indicator switch SW is turned off (a turned-off time toff as depicted in FIG. 5), the current Isw flowing through the indicator switch SW will be less than the reference current, such that the detection circuit 320 is triggered to reset the logic state of the first flag signal S_flag as the disable state. In the period during which the first flag signal S_flag is in the disable state, the de-glitch circuit 330 decreases the counting result ACC with the falling rate until the counting result ACC reaches the second threshold TH2. As shown in FIG. 5, the counting result ACC has the rising rate in the confirmation time ton greater than the falling rate in the turned-off time toff, that is, the counting result ACC rises quickly but falls slowly. The falling rate of the counting result ACC can determine a time required for the counting result ACC to reach the second threshold TH2 (i.e., the turned-off time toff as depicted in FIG. 5). The turned-off time toff can be determined based on design requirements. For example, the turned-off time toff can depend on a maximum power of the indicator switch SW.

When the de-glitch circuit 330 determines that the counting result ACC is less than or equal to the second threshold TH2, the de-glitch circuit 330 resets the logic state of the second flag signal P_flag as the disable state. The control circuit 310 can correspondingly control the indicator switch SW according to the indicator command turn_on_cmd (herein, it is assumed that the indicator command turn_on_cmd is used to "turn on the indicator switch SW") in the period during which the second flag signal P_flag is in the disable state. Accordingly, the indicator switch SW will be turned on to suffer the large short circuit current Isw. The current Isw exceeding the reference current will once again trigger the detection circuit 320 to set the logic state of the first flag signal S_flag as the enable state. Such operation is repeatedly performed until the short circuit event disappears. The periodic turned-off time toff can make an average power of the indicator switch SW less than a rated maximum power of the indicator switch SW, and/or make a temperature of the indicator switch SW lower than a rated maximum temperature of the indicator switch SW.

Figure 6:
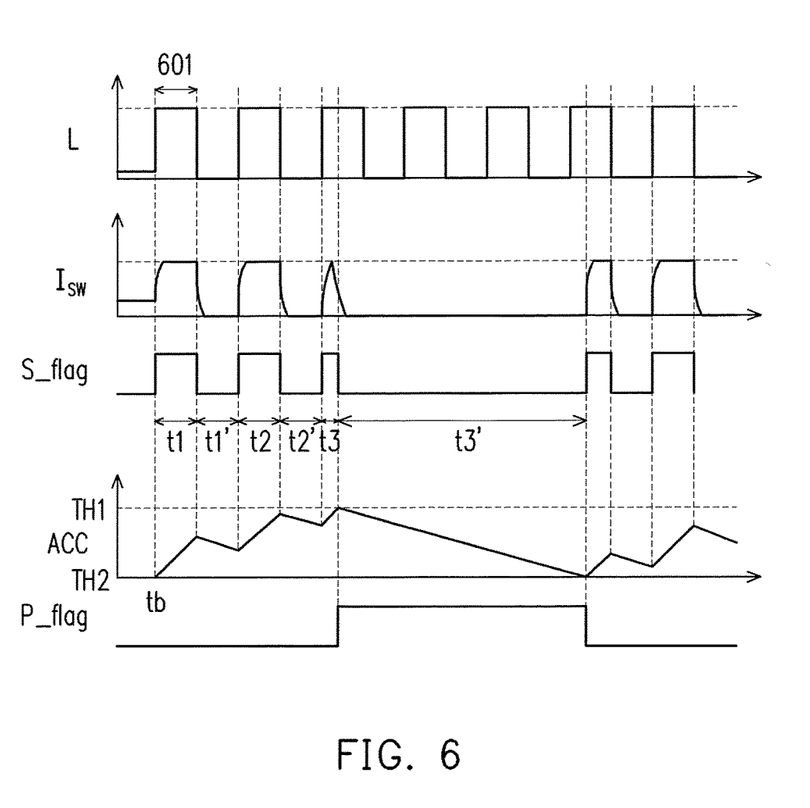
FIG. 6 is a waveform diagram of the counting result ACC and other signals of the de-glitch circuit in the situation where the short circuit event occurs on the indicator pin L (e.g., when the indicator pin L is connected to the AC voltage).

FIG. 6 is a waveform diagram of the counting result ACC and other signals of the de-glitch circuit 330 in the situation where the short circuit event occurs on the indicator pin L (e.g., when the indicator pin L is connected to the AC voltage). Referring to FIG. 3 and FIG. 6, it is assumed that, at a time point tb, the indicator pin L is short-circuited to the AC voltage, and a pulse width 601 of the AC voltage is less than the confirmation time ton depicted in FIG. 5. When the indicator pin L is short-circuited to the AC voltage, the current Isw flowing through the indicator switch SW will exceed the reference current, such that the detection circuit 320 is triggered to set the logic state of the first flag signal S_flag as the enable state. In the period during which the first flag signal S_flag is in the enable state (an enable time t1 depicted in FIG. 6), the de-glitch circuit 330 increases the counting result ACC with the rising rate. When the counting result ACC has not yet reached the first threshold TH1, the AC voltage of the indicator pin L drops to a low electrical potential, resulting in that the current Isw flowing through the indicator switch SW is less than the reference current. The current Isw being less than the reference current will trigger the detection circuit 320 to set the logic state of the first flag signal S_flag as the disable state. In the period during which the first flag signal S_flag is in the disable state (a disable time t1' depicted in FIG. 6), the de-glitch circuit 330 decreases the counting result ACC with the falling rate.

When the counting result ACC has not yet reached the second threshold TH2, the AC voltage of the indicator pin L rises once again, resulting in that the current Isw flowing through the indicator switch SW is greater than the reference current. The current Isw exceeding the reference current will once again trigger the detection circuit 320 to set the logic state of the first flag signal S_flag as the enable state. In the period during which the first flag signal S_flag is in the enable state (an enable time t2 depicted in FIG. 6), the de-glitch circuit 330 once again increases the counting result ACC with the rising rate, as shown in FIG. 6. When the counting result ACC has not yet reached the first threshold TH1, the AC voltage of the indicator pin L once again drops to the low electrical potential, resulting in that the current Isw flowing through the indicator switch SW is less than the reference current. The current Isw being less than the reference current will once again trigger the detection circuit 320 to set the logic state of the first flag signal S_flag as the disable state. In the period during which the first flag signal S_flag is in the disable state (a disable time t2' depicted in FIG. 6), the de-glitch circuit 330 decreases the counting result ACC with the falling rate, as shown in FIG. 6.

When the counting result ACC has not yet reached the second threshold TH2, the AC voltage of the indicator pin L rises yet again, resulting in that the current Isw flowing through the indicator switch SW is greater than the reference current. The current Isw exceeding the reference current will yet again trigger the detection circuit 320 to set the logic state of the first flag signal S_flag as the enable state. In the period during which the first flag signal S_flag is in the enable state (an enable time t3 as depicted in FIG. 6), the de-glitch circuit 330 once again increases the counting result ACC with the rising rate until the counting result ACC reaches the first threshold TH1.

When the de-glitch circuit 330 determines that the counting result ACC is greater than or equal to the first threshold TH1, the de-glitch circuit 330 sets the logic state of the second flag signal P_flag as the enable state. The control circuit 310 can ignore the indicator command turn_on_cmd and control the indicator switch SW to be turned off in the period during which the second flag signal P_flag is in the enable state. In a period during which the indicator switch SW is turned off, the current Isw flowing through the indicator switch SW will be less than the reference current, such that the detection circuit 320 is triggered to reset the first flag signal S_flag as the disable state. In the period during which the first flag signal S_flag is in the disable state (e.g., a disable time t3' as depicted in FIG. 6), the de-glitch circuit 330 decreases the counting result ACC with the falling rate until the counting result ACC reaches the second threshold TH2.

As shown in FIG. 6, when the indicator pin L is unexpectedly short-circuited to the AC voltage (a periodic pulse), because the counting result ACC has the rising rate greater than the falling rate, the counting result ACC can rise to the first threshold TH1 and then the control circuit 310 is triggered to turn off the indicator switch SW to thereby prevent the indicator switch SW from burn-out. Accordingly, even if the indicator pin L is unexpectedly short-circuited to the AC voltage and the pulse width 601 of the AC voltage is less than the confirmation time ton depicted in FIG. 5, the short circuit protection device 300 depicted in FIG. 3 can still effectively protect the indicator switch SW by preventing the indicator switch SW from burn-out.

It should be noted that, under different application scenarios, related functions of the short circuit protection device 300, the control circuit 310, the detection circuit 320 and/or the de-glitch circuit 330 can be implemented as software, firmware or hardware by utilizing common programming languages (e.g., C or C++), hardware description languages (e.g., Verilog HDL or VHDL) or other suitable programming languages. The software (or the firmware) capable of executing the related functions can be arranged into any known computer-accessible media such as magnetic tapes, semiconductor memories, magnetic disks or compact disks (e.g., CD-ROM or DVD-ROM); or the software (or the firmware) may be transmitted via the Internet, a wired communication, a wireless communication or other communication mediums. Said software (or the firmware) can be stored in the computer-accessible media, so that a computer processor can access/execute programming codes of the software (or the firmware). In addition, the device and the method of the invention can also be implemented by a combination of software and hardware.

Figure 10:
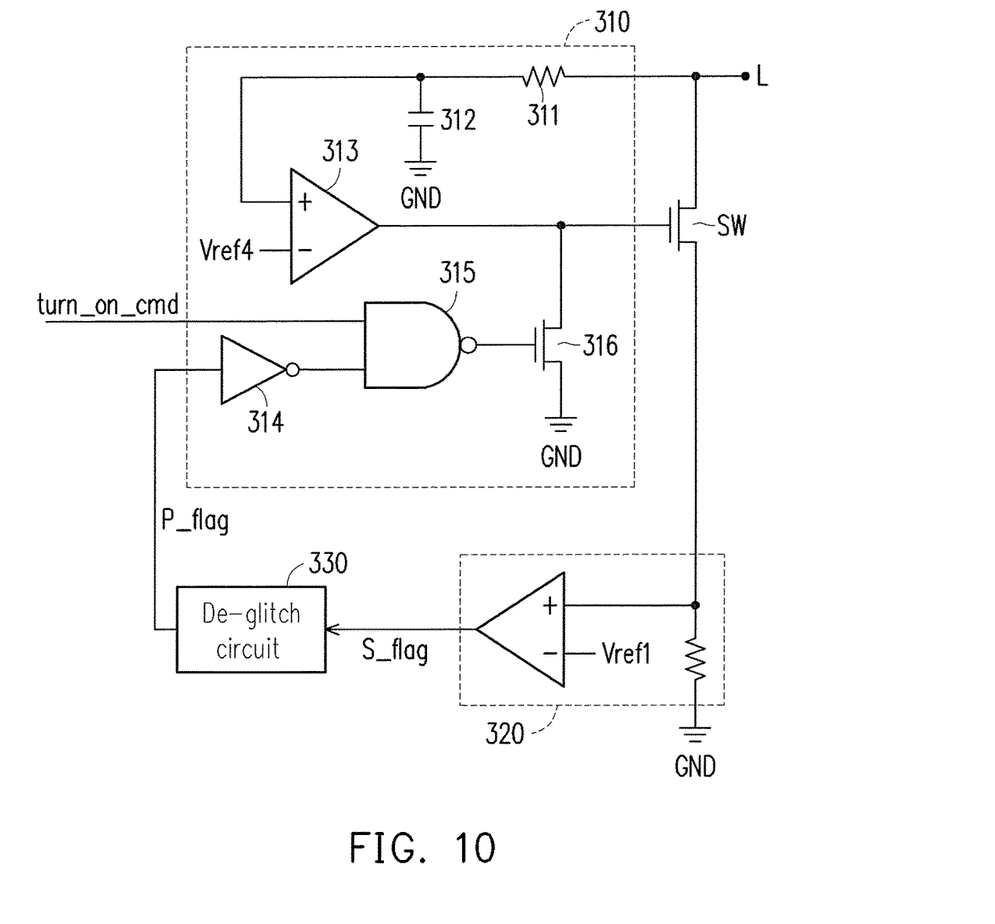
FIG. 10 is a block diagram illustrating circuitry of the control circuit depicted in FIG. 3 according to an embodiment of the invention.

The detection circuit 320 depicted in FIG. 3 of the invention is configured to detect whether the current Isw flowing through the indicator switch SW exceeds the reference current, and the configuration of circuit components and the current detection method thereof are well known by persons skilled in the art. For instance, the detection circuit 320 can include a resistor and a voltage comparator (e.g., as shown in FIG. 10, but the invention is not limited thereto). The resistor can transform the current Isw flowing through the indicator switch SW into a corresponding voltage, and the voltage comparator can compare the corresponding voltage with a reference voltage Vref1 and uses a comparison result thereof as the first flag signal S_flag. In another embodiment, the detection circuit 320 can include a current source, a transistor, a resistor and a voltage comparator.

Figure 7:
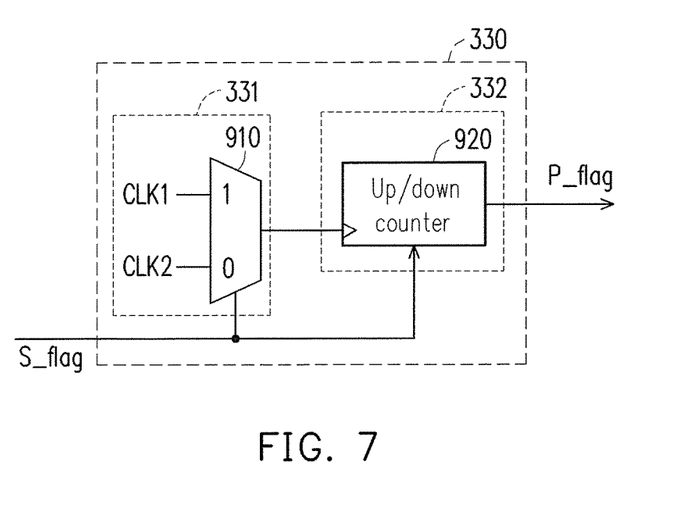
FIG. 7 is a block diagram illustrating circuitry of the de-glitch circuit depicted in FIG. 3 according to an embodiment of the invention.

FIG. 7 is a block diagram illustrating circuitry of the de-glitch circuit 330 depicted in FIG. 3 according to an embodiment of the invention. The de-glitch circuit 330 can receive and perform a de-glitch operation on the first flag signal S_flag, and then output the second flag signal P_flag. In the embodiment depicted in FIG. 7, the de-glitch circuit 330 includes the counting circuit 332. In the period during which the first flag signal S_flag is in the first logic state (e.g., the enable state), the counting circuit 332 increases the counting result ACC with the rising rate. In the period during which the first flag signal S_flag is in the second logic state (e.g., the disable state), the counting circuit 332 decreases the counting result ACC with the falling rate. Herein, the rising rate is greater than the falling rate. The counting circuit 332 sets the logic state of the second flag signal P_flag according to the relationship between the counting result ACC and the threshold TH.

In the embodiment depicted in FIG. 7, the de-glitch circuit 330 may further includes the rate circuit 331. The rate circuit 331 can provide the rising rate and the falling rate to the counting circuit 332. The rate circuit 331 includes a multiplexer 910, and the counting circuit 332 includes an up/down counter 920. A first selection terminal of the multiplexer 910 is coupled to a first clock signal CLK1. A second selection terminal of the multiplexer 910 is coupled to a second clock signal CLK2. A control terminal of the multiplexer 910 is coupled to the first flag signal S_flag. A common terminal of the multiplexer 910 is coupled to a clock trigger terminal of the up/down counter 920 of the counting circuit 332. A frequency of the first clock signal CLK1 is greater than a frequency of the second clock signal CLK2. An up/down control terminal of the up/down counter 920 is coupled to the first flag signal S_flag. In the period during which the first flag signal S_flag is in the first logic state (e.g., the enable state), the multiplexer 910 selects to provide the first clock signal CLK1 with higher frequency to the clock trigger terminal of the up/down counter 920 of the counting circuit 332, and the up/down counter 920 up-counts the counting result ACC according to the frequency of the first clock signal CLK1. In the period during which the first flag signal S_flag is in the second logic state (e.g., the disable state), the multiplexer 910 selects to provide the second clock signal CLK2 with lower frequency to the clock trigger terminal of the up/down counter 920 of the counting circuit 332, and the up/down counter 920 down-counts the counting result ACC according to the frequency of the second clock signal CLK2. Therefore, the counting result ACC can rise quickly but fall slowly.

The up/down counter 920 can also compare the counting result ACC with the threshold TH. In the present exemplary embodiment, the threshold TH includes the first threshold TH1 and the second threshold TH2. The up/down counter 920 sets the logic state of the second flag signal P_flag as the third logic state (e.g., the enable state) when the counting result ACC is greater than or equal to the first threshold TH1. The up/down counter 920 sets the logic state of the second flag signal P_flag as the fourth logic state (e.g., the disable state) when the counting result ACC is less than or equal to the second threshold TH2.

Figure 8:
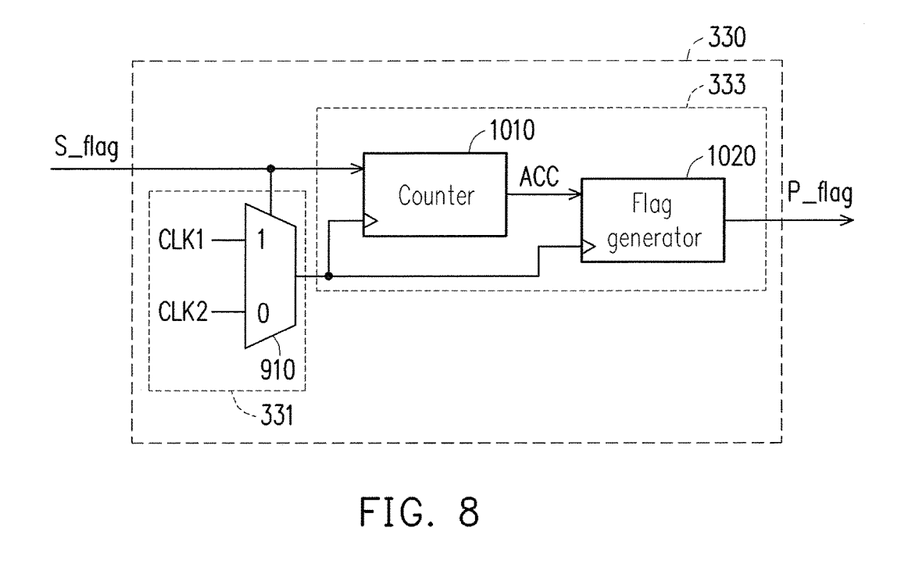
FIG. 8 is a block diagram illustrating circuitry of the de-glitch circuit depicted in FIG. 3 according to another embodiment of the invention.

FIG. 8 is a block diagram illustrating circuitry of the de-glitch circuit 330 depicted in FIG. 3 according to another embodiment of the invention. The de-glitch circuit 330 includes the rate circuit 331 and the counting circuit 333. The rate circuit 331 and the counting circuit 333 depicted in FIG. 8 may be inferred with reference to related descriptions for the rate circuit 331 and the counting circuit 332 depicted in FIG. 7, which are not repeated hereinafter. In the embodiment depicted in FIG. 8, the counting circuit 333 includes a counter 1010 and a flag generator 1020. A clock trigger terminal of the counter 1010 is coupled to the common terminal of the multiplexer 910 of the rate circuit 331. An up/down control terminal of the counter 1010 is coupled to the first flag signal S_flag. In the period during which the first flag signal S_flag is in the first logic state (e.g., the enable state), the counter 1010 up-counts the counting result ACC according to the first clock signal CLK1 with higher frequency. In the period during which the first flag signal S_flag is in the second logic state (e.g., the disable state), the counter 1010 down-counts the counting result ACC according to the second clock signal CLK2 with lower frequency.

An input terminal of the flag generator 1020 is coupled to an output terminal of the counter 1010 to receive the counting result ACC. The flag generator 1020 compares the counting result ACC with the threshold TH. In the present exemplary embodiment, the threshold TH includes the first threshold TH1 and the second threshold TH2. The flag generator 1020 sets the logic state of the second flag signal P_flag as the third logic state (e.g., the enable state) when the counting result ACC is greater than the first threshold TH1. The flag generator 1020 sets the logic state of the second flag signal P_flag as the fourth logic state (e.g., the disable state) when the counting result ACC is less than or equal to the second threshold TH2.

Figure 9:
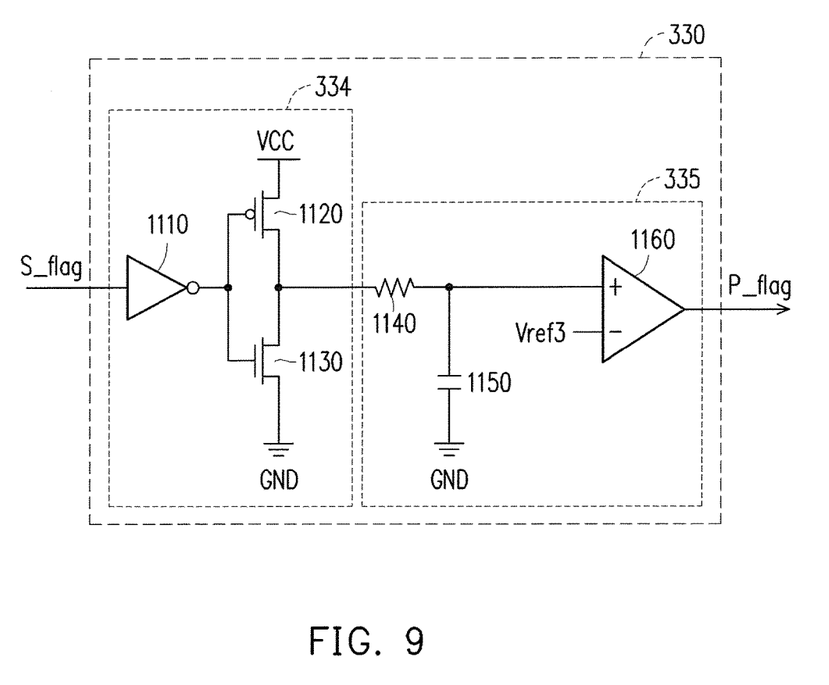
FIG. 9 is a block diagram illustrating circuitry of the de-glitch circuit depicted in FIG. 3 according to yet another embodiment of the invention.

FIG. 9 is a block diagram illustrating circuitry of the de-glitch circuit 330 depicted in FIG. 3 according to yet another embodiment of the invention. The de-glitch circuit 330 includes the rate circuit 334 and the counting circuit 335. The rate circuit 334 and the counting circuit 335 depicted in FIG. 9 may be inferred with reference to related descriptions for the rate circuit 331 and the counting circuit 332, which are not repeated hereinafter. In the embodiment depicted in FIG. 9, the rate circuit 334 includes an inverter 1110, a first transistor 1120 and a second transistor 1130, and the counting circuit 335 includes a resistor 1140, a capacitor 1150 and a voltage comparator 1160. An input terminal of the inverter 1110 is coupled to the first flag signal S_flag. A first terminal of the first transistor 1120 is coupled to a system voltage VCC. A control terminal of the first transistor 1120 is coupled to an output terminal of the inverter 1110. A first terminal of the second transistor 1130 is coupled to a reference voltage (e.g., the ground voltage GND). A second terminal of the second transistor 1130 is coupled to a second terminal of the first transistor 1120. A control terminal of the second transistor 1130 is coupled to the output terminal of the inverter 1110.

A first terminal of the resistor 1140 is coupled to the second terminal of the first transistor 1120 and the second terminal of the second transistor 1130. A first terminal of the capacitor 1150 is coupled to a second terminal of the resistor 1140, and a second terminal of the capacitor 1150 is coupled to a reference voltage (e.g., the ground voltage GND). An inverting input terminal of the voltage comparator 1160 is coupled to a reference voltage Vref3. A level of the reference voltage Vref3 can be determined based on design requirements. A non-inverting input terminal of the voltage comparator 1160 is coupled to the first terminal of the capacitor 1150. An output terminal of the voltage comparator 1160 outputs the second flag signal P_flag.

A channel width of the second transistor 1130 is smaller than a channel width of the first transistor 1120. In other words, a current of the first transistor 1120 is greater than a current of the second transistor 1130. In the period during which the first flag signal S_flag is in the enable state, the first transistor 1120 is turned on while the second transistor 1130 is turned off, so that the capacitor 1150 can be quickly charged by the first transistor 1120 with greater current. Therefore, an electrical potential of the capacitor 1150 rises with higher speed (which is equivalent to increase the counting result ACC with the greater rising rate). In the period during which the first flag signal S_flag is in the disable state, the first transistor 1120 is turned off while the second transistor 1130 is turned on, so that the capacitor 1150 can be slowly discharged by the second transistor 1130 with smaller current. Therefore, the electrical potential of the capacitor 1150 falls with slower speed (which is equivalent to decrease the counting result ACC with the less falling rate). The voltage comparator 1160 compares the electrical potential of the capacitor 1150 with the reference voltage Vref3 (which is equivalent to compare the counting result ACC with the threshold TH), and uses a comparison result thereof as the second flag signal P_flag.

FIG. 10 is a block diagram illustrating circuitry of the control circuit 310 depicted in FIG. 3 according to an embodiment of the invention. In the embodiment depicted in FIG. 10, the control circuit 310 includes a resistor 311, a capacitor 312, an operation amplifier 313, a NOT gate 314, a NAND gate 315 and a transistor 316. A first terminal of the resistor 311 is coupled to a first terminal of the indicator switch SW and the indicator pin L. A second terminal of the indicator switch SW is coupled to a reference voltage (e.g., the ground voltage GND). A first terminal of the capacitor 312 is coupled to a second terminal of the resistor 311. A second terminal of the capacitor 312 is coupled to a reference voltage (e.g., the ground voltage GND). An inverting input terminal of the operational amplifier 313 is coupled to a reference voltage Vref4. A non-inverting input terminal of the operational amplifier 313 is coupled to the first terminal of the capacitor 312. An output terminal of the operational amplifier 313 is coupled to the control terminal of the indicator switch SW. A level of the reference voltage Vref4 can be determined based on design requirements. For example, the level of the reference voltage Vref4 can be 1.2V. The operational amplifier 313 and the indicator switch SW can lock an electrical potential of the indicator pin L at the reference voltage Vref4.

An input terminal of the NOT gate 314 is coupled to an output terminal of the de-glitch circuit 330 to receive the second flag signal P_flag. A first input terminal of the NAND gate 315 can receive the indicator command turn_on_cmd. A second input terminal of the NAND gate 315 is coupled to an output terminal of the NOT gate 314. A control terminal of the transistor 316 is coupled to an output terminal of the NAND gate 315. A first terminal of the transistor 316 is coupled to the control terminal of the indicator switch SW. A second terminal of the transistor 316 is coupled to a reference voltage (e.g., the ground voltage GND). In the period during which the second flag signal P_flag is in the disable state, the indicator command turn_on_cmd can control the transistor 316 through the NAND gate 315 to thereby control the indicator switch SW. The NAND gate 315 can block the indicator command turn_on_cmd and control the indicator switch SW to be turned off through the transistor 316 in the period during which the second flag signal P_flag is in the enable state.

In summary, the de-glitch circuit 330 and the de-glitch method as described in the embodiments of the invention are capable of effectively detecting the periodic pulse of the first flag signal S_flag. In the situation where a periodic pulse width of the first flag signal S_flag is greater than the threshold TH, the first flag signal S_flag can trigger the de-glitch circuit 330 to set the logic state of the second flag signal P_flag. In the situation where the periodic pulse width of the first flag signal S_flag is less than the confirmation time, the periodic pulse of the first flag signal S_flag can still trigger the de-glitch circuit 330 to set the logic state of the second flag signal P_flag. In the situation where a non-periodic pulse width of the first flag signal S_flag is less than the confirmation time, the non-periodic pulse of the first flag signal S_flag will not trigger the de-glitch circuit 330 so that the logic state of the flag signal P_flag can be reset. The de-glitch circuit 330 can be applied in the short circuit protection device 300. In the situation where the periodic pulse width of the short circuit current of the indicator switch SW is less than the confirmation time, the periodic pulse of the short circuit current can still trigger the short circuit protection device 300 to ignore the indicator command and turn off the indicator switch SW.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A de-glitch circuit for performing a de-glitch operation on a first flag signal to output a second flag signal, and the de-glitch circuit comprising:
    a counting circuit, increasing a counting result with a rising rate in a period during which the first flag signal is in a first logic state, decreasing the counting result with a falling rate in a period during which the first flag signal is in a second logic state, and setting a logic state of the second flag signal according to a relationship between the counting result and a threshold, wherein the rising rate is greater than the falling rate.

2. The de-glitch circuit of claim 1, further comprising a rate circuit providing the rising rate and the falling rate.

3. The de-glitch circuit of claim 2, wherein:
    the rate circuit comprises a multiplexer having a first selection terminal coupled to a first clock signal, a second selection terminal coupled to a second clock signal, a control terminal coupled to the first flag signal, and a common terminal coupled to a clock trigger terminal of the counting circuit;
    a frequency of the first clock signal is greater than a frequency of the second clock signal; and
    the multiplexer selects to provide the first clock signal to the clock trigger terminal of the counting circuit in the period during which the first flag signal is in the first logic state, and selects to provide the second clock signal to the clock trigger terminal of the counting circuit in the period during which the first flag signal is in the second logic state.

4. The de-glitch circuit of claim 3, wherein the counting circuit comprises an up/down counter, having a clock trigger terminal coupled to the common terminal of the multiplexer, and an up/down control terminal coupled to the first flag signal, and the up/down counter is configured to:
    up-counts the counting result according to the frequency of the first clock signal in the period during which the first flag signal is in the first logic state; and
    down-counts the counting result according to the frequency of the second clock signal in the period during which the first flag signal is in the second logic state.

5. The de-glitch circuit of claim 4, wherein the up/down counter is further configured to:
    compares the counting result with the threshold including a first threshold and a second threshold;
    sets the logic state of the second flag signal as a third logic state when the counting result is greater than or equal to the first threshold;
    sets the logic state of the second flag signal as a fourth logic state when the counting result is less than or equal to the second threshold; and
    maintains the logic state of the second flag signal when the counting result is less than the first threshold and greater than the second threshold.

6. The de-glitch circuit of claim 3, wherein the counting circuit comprises a counter and a flag generator, and wherein:
    the counter has a clock trigger terminal coupled to the common terminal of the multiplexer, and an up/down control terminal coupled to the first flag signal;
    the counter up-counts the counting result according to the frequency of the first clock signal in the period during which the first flag signal is in the first logic state, and down-counts the counting result according to the frequency of the second clock signal in the period during which the first flag signal is in the second logic state;
    the flag generator has an input terminal coupled to an output terminal of the counter to receive the counting result;
    the flag generator compares the counting result with the threshold including a first threshold and a second threshold; and
    the flag generator sets the logic state of the second flag signal as a third logic state when the counting result is greater than or equal to the first threshold, sets the logic state of the second flag signal as a fourth logic state when the counting result is less than or equal to the second threshold, and maintains the logic state of the second flag signal when the counting result is less than the first threshold and greater than the second threshold.

7. The de-glitch circuit of claim 2, wherein the rate circuit comprises an inverter, a first transistor and a second transistor, and the counting circuit comprises a resistor, a capacitor and a voltage comparator.

8. The de-glitch circuit of claim 7, wherein:
    an input terminal of the inverter is coupled to the first flag signal;
    a first terminal of the first transistor is coupled to a system voltage, and a control terminal of the first transistor is coupled to an output terminal of the inverter;
    a first terminal of the second transistor is coupled to a first reference voltage, a second terminal of the second transistor is coupled to a second terminal of the first transistor, a control terminal of the second transistor is coupled to the output terminal of the inverter, and a channel width of the second transistor is smaller than a channel width of the first transistor;
    a first terminal of the resistor is coupled to the second terminal of the first transistor and the second terminal of the second transistor;

a first terminal of the capacitor is coupled to a second terminal of the resistor, and a second terminal of the capacitor is coupled to the first reference voltage; and an inverting input terminal of the voltage comparator is coupled to a second reference voltage, a non-inverting input terminal of the voltage comparator is coupled to the first terminal of the capacitor, and an output terminal of the voltage comparator outputs the second flag signal.

9. A de-glitch method, for performing a de-glitch operation on a first flag signal to obtain a second flag signal, the method comprising steps of:

increasing a counting result with a rising rate in a period during which the first flag signal is in a first logic state;

decreasing the counting result with a falling rate in a period during which the first flag signal is in a second logic state, wherein the rising rate is greater than the falling rate; and setting a logic state of a second flag signal according to a relationship between the counting result and a threshold.

10. The de-glitch method of claim 9, wherein the threshold comprises a first threshold and a second threshold.

11. The de-glitch method of claim 10, comprising a step of setting the logic state of the second flag signal as an enable state when the counting result is greater than or equal to the first threshold.

12. The de-glitch method of claim 10, comprising a step of setting the logic state of the second flag signal as a disable state when the counting result is less than or equal to the second threshold.

13. The de-glitch method of claim 10, comprising a step of maintaining the logic state of the second flag signal when the counting result is less than the first threshold and greater than the second threshold.

14. A short circuit protection device for an indicator switch of an alternator, comprising:

a detection circuit, coupled to the indicator switch, and configured to detect a current flowing through the indicator switch and set a logic state of a first flag signal according to the current;

a de-glitch circuit, having an input terminal coupled to an output terminal of the detection circuit to receive the first flag signal, and configured to select to increase a counting result with a rising rate or decrease the counting result with a falling rate according to the logic state of the first flag signal, and configured to set a logic state of a second flag signal according to a relationship between the counting result and a threshold; and a control circuit, having a first input terminal configured to receive an indicator command, a second input terminal coupled to an output terminal of the de-glitch circuit to receive the second flag signal, and an output terminal coupled to a control terminal of the indicator switch, wherein the control circuit correspondingly controls the indicator switch according to the logic state of the second flag signal.

15. The short circuit protection device of claim 14, wherein the control circuit correspondingly controls the indicator switch according to the indicator command in a period during which the second flag signal is in a disable state, and the control circuit ignores the indicator command and controls the indicator switch to turn off in a period during which the second flag signal is in an enable state.

16. The short circuit protection device of claim 14, wherein the control circuit comprises:

a resistor, having a first terminal coupled to a first terminal of the indicator switch, wherein a second terminal of the indicator switch is coupled to a first reference voltage;

a capacitor, having a first terminal coupled to a second terminal of the resistor, and a second terminal coupled to the first reference voltage;

an operational amplifier, having an inverting input terminal coupled to a second reference voltage, a non-inverting input terminal coupled to the first terminal of the capacitor, and an output terminal coupled to the control terminal of the indicator switch;

a NOT gate, having an input terminal coupled to the output terminal of the de-glitch circuit to receive the second flag signal;

a NAND gate, having a first input terminal configured to receive the indicator command, and a second input terminal coupled to an output terminal of the NOT gate; and a transistor, having a control terminal coupled to an output terminal of the NAND gate, a first terminal coupled to the control terminal of the indicator switch, and a second terminal coupled to the first reference voltage.

17. The short circuit protection device of claim 14, wherein the de-glitch circuit comprises a rate circuit providing the rising rate and the falling rate, and wherein the rising rate is greater than the falling rate.

18. The short circuit protection device of claim 17, wherein the de-glitch circuit further comprises a counting circuit coupled to the rate circuit and configured to set the logic state of the second flag signal according to the relationship between the counting result and the threshold.

19. The short circuit protection device of claim 18, wherein the rate circuit provides the rising rate to the counting circuit and the counting circuit increases the counting result with the rising rate in the period during which the first flag signal is in an enable state.

20. The short circuit protection device of claim 18, wherein the rate circuit provides the falling rate to the counting circuit and the counting circuit decreases the counting result with the falling rate in the period during which the first flag signal is in a disable state.

* * * * *